(12) United States Patent
Katchmar

(10) Patent No.: US 6,194,782 B1
(45) Date of Patent: Feb. 27, 2001

(54) MECHANICALLY-STABILIZED AREA-ARRAY DEVICE PACKAGE

(75) Inventor: Roman Katchmar, Gloucester (CA)

(73) Assignee: Nortel Networks Limited, Montreal (CA)

( * ) Notice: Under 35 U.S.C. 154(b), the term of this patent shall be extended for 0 days.

(21) Appl. No.: 09/103,802

(22) Filed: Jun. 24, 1998

(51) Int. Cl.$^7$ ................................................. H01L 23/34
(52) U.S. Cl. ..................... 257/738; 257/718; 257/719; 257/720; 257/734; 257/736; 257/737; 257/760; 257/774; 257/777; 257/778; 257/780; 361/718; 361/719; 361/720; 361/760
(58) Field of Search ................................... 257/778, 737, 257/738, 734, 774, 787, 773, 777, 780; 361/718, 719, 720, 736, 760

(56) References Cited

U.S. PATENT DOCUMENTS

| | | | |
|---|---|---|---|
| 5,684,677 | * 11/1997 | Ucidida et al. | 257/737 |
| 5,834,848 | * 11/1998 | Iwasaki | 257/778 |
| 5,900,675 | * 5/1999 | Appelt et al. | 257/778 |

OTHER PUBLICATIONS

Bongtae Han et al., "Determination of an Effective Coefficient of Thermal Expansion of Electronic Packaging Components: A Whole–Field Approach", Jun. 1996, IEEE Transactions of Components, Packaging, and Manufacturing Technology–Part A, vol. 19, No. 2., pp. 240–247.

Jean–Paul Clech et al., "A Comprehensive Surface Mount Reliability Model Covering Several Generations of Packaging and Assembly Technology", Dec. 1993, IEEE Transactions on Components, Hybrids, and Manufacturing Technology, vol. 16, No. 8., pp. 949–960.

Robert Darveaux, "Crack Initiation and Growth in Surface Mount Solder Joints" 1993, ISHM Conference Proceedings, pp. 86–97.

Roman Katchmar, et al., "Factors Influencing Fatigue Life of Area–Array Solder Joints", 1996, ISHM Conference Proceedings, pp. 551–556.

Roman Katchmar, "Position Dependence of CTE in Plastic Ball Grid Array's", 1994 IEPS Conference Proceedings, pp. 271–283.

Andrew J. Mawer, et al., "Plastic BGA Solder Joint Reliability Considerations", 1994 SMI Conference Proceedings, pp. 239–251.

Randy Johnson, et al., "A Feasibility Study of Ball Grid Array Packaging", 1993 Proceedings of NEPCON East, pp. 413–421.

* cited by examiner

Primary Examiner—Carl Whitehead, Jr.
Assistant Examiner—Matthew E. Warren

(57) ABSTRACT

A surface mount area-array integrated circuit package is disclosed. The package consists of a package substrate having conductive vias and internal and external conductive traces, a semiconductor die electrically and mechanically connected to the top surface of package substrate, an area-array of conductive surface mount terminations electrically and mechanically connected to the bottom of the package substrate, and at least one adhesive mass. The at least one adhesive mass is located on the bottom of the package substrate and replaces the conductive terminations in the area(s) where the joint strain energy density is calculated to be the greatest. When mounted on a substrate, the at least one adhesive mass adheres the package to the substrate. Increased mechanical and electrical reliability is thus achieved.

18 Claims, 7 Drawing Sheets

MECHANICALLY-STABILIZED AREA-ARRAY DEVICE PACKAGE

FIELD OF THE INVENTION

This invention relates to integrated circuit packages in general, and specifically to surface mount area-array packages.

BACKGROUND OF THE INVENTION

Advances in the design of integrated circuit dies have created a demand for integrated circuit package designs which can accommodate a large number of interconnections between the package and the substrate without becoming excessively large. An important requirement of these high density integrated circuit package designs is that they maintain a low interconnection failure rate despite the large number of interconnections.

One such high density package design is a surface mount area-array package. This package does not employ formed metal leads. Instead, interconnection between the package and the substrate is provided by an array of metal alloy or electrically conductive polymer based compound terminations which form joints to mechanically and electrically connect the package and the substrate.

One type of such package is a plastic ball grid array (PBGA) package. The substrate of the package is composed of a laminated glass fibre resin structure which has metal traces on the outside and between the laminated layers and vias to interconnect the traces. An integrated circuit die is positioned on top of or adjacent the top of the package substrate and electrically connected to the traces. Through the vias, these traces connect to solder balls typically arrayed in regular concentric rings, usually square in shape, upon the bottom of the PBGA package. The integrated circuit die and the top of the substrate are encapsulated in a molded plastic for mechanical and environmental protection. The PBGA package is mounted upon a substrate employing known procedures such as reflow.

It was known that the solder ball interconnections beneath the integrated circuit die were the first to fail in operation when the PBGA was mounted upon the most commonly used substrate, namely a printed circuit board (PCB) formed with a laminated glass fibre resin based material. A prior solution for attempting to increase electrical reliability was to remove the interconnections which were beneath the die, known in the art as depopulating solder balls. However, this decreases the number of solder ball joints attaching the package to the substrate. The mechanical problem created, of not having sufficient attachment of the package to the substrate, is particularly significant in chip-scale packages (CSP's). A CSP is any package in which the package is only slightly larger than the die.

In *Factors Influencing Fatigue Life of Area-Array Solder Joints,* by R. Katchmar, E. Goulet and J. Laliberte, presented at 1996 ISHM in Minneapolis, the authors described a process by which they developed a formula for predicting the incremental spring stiffness $\Delta K_i$ of the $i^{th}$ ring of solder balls from the centre of the package. As a result of applying this formula to PBGAs mounted on printed circuit boards, it was theorized that the solder balls under the die should be retained, rather than removed, in order to extend the life of the remaining solder ball connections. However, the formulas published in the paper contained errors; in particular, the formula for calculating $\Delta K_i$ was incorrect. Also, no practical solutions have been proposed and the paper is silent with regard to ceramic column grid array (CCGA) packages and CSP's.

SUMMARY OF THE INVENTION

It is an object of the present invention to provide an improved integrated circuit package and method of connecting an integrated circuit package to a substrate in which one or more of the disadvantages of the prior art is obviated or mitigated.

Therefore, the invention may be summarized according to a first broad aspect as an integrated circuit package for mounting on a substrate of local coefficient of thermal expansion $\alpha_s$ comprising: a package substrate of local coefficient of thermal expansion $\alpha_{pkg}$; a semiconductor die mounted either on or adjacent a top surface of the package substrate and electrically connected thereto; an array of conductive surface mount terminations of finite thickness mounted on a bottom surface of the package substrate at least some of which are connected through the package substrate to the semiconductor die; the terminations being arranged in rings i around a neutral point of the package; each of the rings being a distance $DNP_i$ from the neutral point of the package; each of the rings having a number of terminations $n_i$; each ring having a termination pitch P; the terminations having a modulus of elasticity $E_t$ and a structural thickness $h_t$; the package having a modulus of elasticity $E_{pkg}$ and a structural thickness $h_{pkg}$; successive rings having a change in the distance from the neutral point of the package $\alpha DNP$; each of the rings cycling through a temperature range $\alpha T_i$ during operation; and at least one adhesive mass; the at least one adhesive mass being located on the bottom of the package substrate in the area(s) where the terminations when mounted upon the substrate to form joints would have highest joint strain energy density $W_{Gi}$ as calculated by the equations $$W_{Gi} = k_i \{DNP_i(\alpha_s - \alpha_{pkg})_i \alpha T_i\}^2$$

$$k_i = 1/4n_i \Sigma (1/\Delta K_j)_{j=1,i}$$

$$\Delta K_j = (P/\Delta DNP)_j / \{1/(Eh)_t + 1/(Eh)_{pkg}\}_j$$

such that when mounted upon the substrate the at least one adhesive mass will co-operate with the package substrate and the substrate to adhere the package substrate and the substrate to each other.

According to another aspect of the present invention, there is provided an integrated circuit package for mounting on a substrate comprising: a package substrate; a semiconductor die mounted either on or adjacent a top surface of the package substrate and electrically connected thereto; an array of conductive surface mount terminations of finite thickness mounted on a bottom surface of the plastic package substrate at least some of which are connected through the package substrate to the semiconductor die; and at least one adhesive mass; the at least one adhesive mass being located on the bottom of the package substrate such that when mounted upon the substrate the at least one adhesive mass will co-operate with the package substrate and the substrate to adhere the package substrate and the substrate to each other.

According to a further aspect of the present invention, there is provided an integrated circuit package for mounting on a substrate comprising: a plastic package substrate having a coefficient of thermal expansion substantially the same as the coefficient of thermal expansion of the substrate; a semiconductor die mounted either on or adjacent a top surface of the plastic package substrate and electrically connected thereto; an array of conductive surface mount terminations of finite thickness mounted on a bottom surface of the plastic package substrate at least some of which are connected through the plastic package substrate to the semiconductor die; and an adhesive mass; the adhesive mass being located on the bottom of the plastic package substrate substantially beneath the semiconductor die such that when mounted upon the substrate the adhesive mass will co-operate with the plastic package substrate and the substrate to adhere the package substrate and the substrate to each other.

According to a further aspect of the present invention, there is provided an integrated circuit package for mounting on a substrate comprising: a ceramic package substrate having a coefficient of thermal expansion substantially lower than the coefficient of thermal expansion of the substrate; a semiconductor die mounted either on or adjacent a top surface of the ceramic package substrate and electrically connected thereto; an array of conductive surface mount terminations of finite thickness mounted on a bottom surface of the substrate at least some of which are connected through the substrate to the semiconductor die; a plurality of adhesive masses; the adhesive masses being located on the bottom of the ceramic package substrate at the corners of the ceramic package substrate such that when mounted upon the substrate the adhesive masses will co-operate with the ceramic package substrate and the substrate to adhere the ceramic package substrate and the substrate to each other.

According to yet another aspect, there is provided a method of mounting an integrated circuit package on a substrate for electrical connection of an array of conductive surface mount terminations on the package to the substrate comprising: applying an adhesive mass to a bottom surface of the package; aligning and attaching the array of conductive surface mount terminations and the adhesive mass to the substrate; and fixing the adhesive mass.

According to a still further aspect, there is provided a method of mounting on a substrate a plastic ball grid array package having a package substrate carrying a semiconductor die, the package substrate having a coefficient of thermal expansion substantially the same as the coefficient of thermal expansion of the substrate, the method comprising: providing the plastic ball grid array package with a plurality of solder balls on a bottom surface of the package substrate at locations other than under the semiconductor die; providing the plastic ball grid array package with a solderable pad on the bottom surface of the package substrate under the semiconductor die; providing the substrate with a solderable pad on a top surface under the area where the semiconductor die will be positioned; applying a solder mass, substantially equal in thickness to the solder balls, on the pad on the plastic ball grid array; applying a flux means to the substrate; aligning and placing the plastic ball grid array package on the substrate; and reflowing the solder.

According to another aspect, there is provided a method of mounting on a substrate a plastic ball grid array package having a package substrate carrying a semiconductor die, the package substrate having a coefficient of thermal expansion substantially the same as the coefficient of thermal expansion of the substrate, the method comprising: providing the plastic ball grid array package with a plurality of solder balls on a bottom surface of the package substrate at locations other than under the semiconductor die; applying a flux means to the substrate; aligning and placing the plastic ball grid array package on the substrate; reflowing the solder; injecting an adhesive plastic mass between the package substrate and the substrate under the area where the semiconductor die is located; curing the adhesive plastic mass.

According to another aspect, there is provided a method of mounting on a substrate a plastic ball grid array package having a package substrate carrying a semiconductor die, the package substrate having a coefficient of thermal expansion substantially the same as the coefficient of thermal expansion of the substrate, the method comprising: providing the plastic ball grid array package with a plurality of solder balls on a bottom surface of the package substrate; applying a flux means to the substrate; aligning and placing the plastic ball grid array package on the substrate; reflowing the solder; injecting an non-electrically conductive adhesive plastic mass between the package substrate and the substrate; curing the adhesive plastic mass.

According to a still further aspect, there is provided a method of mounting on a substrate a ceramic surface mount area-array package having a package substrate carrying a semiconductor die, the package substrate having a coefficient of thermal expansion substantially lower than the coefficient of thermal expansion of the substrate, the method comprising: providing the ceramic surface mount area-array package with an array of solderable surface mount terminations on a bottom surface of the package substrate at locations other than the corners of the package substrate; providing the ceramic surface mount area-array package with solderable pads on the bottom surface of the package substrate at the corners of the package substrate; providing the substrate with a solderable pads on a top surface under the area where the corners of the package substrate will be positioned; applying solder masses, substantially equal in thickness to the solderable surface mount terminations, on the pads on the ceramic ball grid array; applying a flux means to the substrate; aligning and placing the ceramic surface mount area-array package on the substrate; and reflowing the solder.

According to yet another aspect, there is provided a method of mounting on a substrate a ceramic surface mount area-array package having a package substrate carrying a semiconductor die, the package substrate having a coefficient of thermal expansion substantially lower than the coefficient of thermal expansion of the substrate, the method comprising: providing the ceramic surface mount area-array package with an array of solderable surface mount terminations on a bottom surface of the package substrate at locations other than the corners of the package substrate; applying a flux means to the substrate; aligning and placing the ceramic surface mount area-array package on the substrate; reflowing the solder; injecting adhesive plastic masses between the package substrate and the substrate under the areas where the corners of the package substrate will be positioned; curing the adhesive plastic masses.

According to yet another aspect, there is provided an integrated circuit package for mounting on a substrate comprising: a package substrate; a semiconductor die mounted either on or adjacent a top surface of the package substrate and electrically connected thereto; an array of conductive surface mount terminations of finite thickness mounted on a bottom surface of the package substrate at least some of which are connected through the package substrate to the semiconductor die; and at least one adhesive mass; the at least one adhesive mass being located on the bottom of the package substrate in the area(s) where the terminations when mounted upon the substrate to form joints would have highest joint strain energy density as calculated by numerical methods such that when mounted upon the substrate the at least one adhesive mass will co-operate with the package substrate and the substrate to adhere the package substrate and the substrate to each other.

An advantage of this invention is that it mechanically stabilizes the area-array package from handling and bending stresses of the substrate during installation.

Another advantage of this invention is that it makes the assembly more robust to heat-sink attachment forces.

Yet another advantage is that the invention provides for an alternative cooling path into the substrate, since it directly couples the device package to the substrate which may act as a heat sink.

A further advantage of this invention is that it increases the other solder joint fatigue life due to temperature cycling of environmental or equipment temperature.

Finally, the invention provides for easy manufacture as the solder mass is concurrently soldered or unsoldered with all other joints.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

Figure 1:
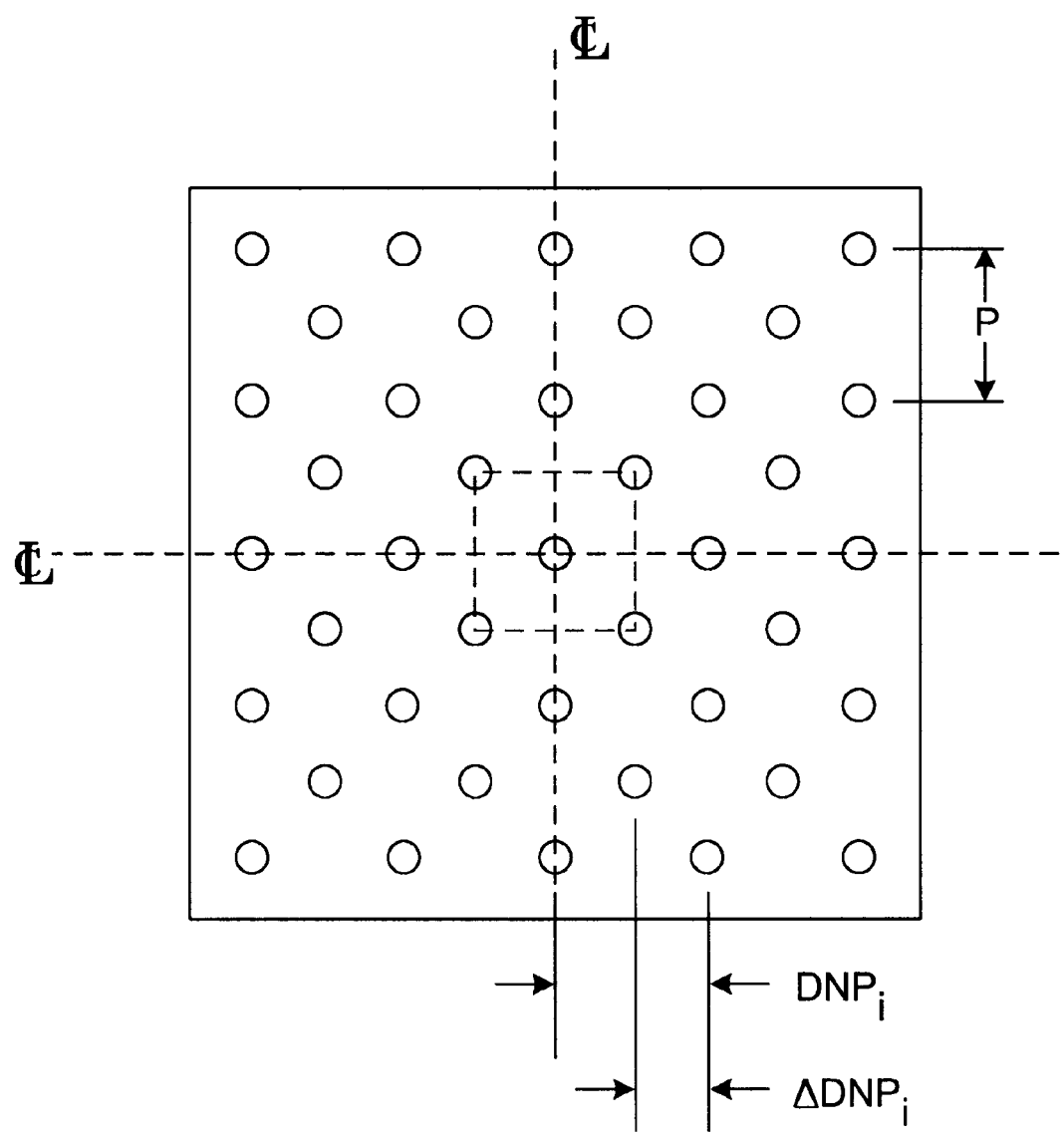
FIG. 1 is a bottom view of a conventional PBGA package with the dimensions used in the strain energy calculations indicated.

This invention employs an adhesive mass to mechanically connect a surface mount area-array package and substrate in the locations where the joint strain energy density, if joints were present, would be greatest. Joint strain energy density $W_{Gi}$ of a concentric ring of surface mount area-array joints is governed by the equation:

$$W_{Gi}=k_i\{DNP_i(\alpha_s-\alpha_{pkg})_i \Delta T_i\}^2$$

where:
$\alpha_s$ is the local coefficient of thermal expansion of the substrate;
$\alpha_{pkg}$ is the local coefficient of thermal expansion of the package;
$DNP_i$ is the distance to neutral point, i.e. point of no lateral displacements, of the joints; in a symmetrical package construction as shown in FIG. 1, the neutral point is generally the centre of the package (intersection of the centerlines identified by ℄)and the $DNP_i$ is measured from there;
$\alpha T_i$ is the temperature excursion through which the $i^{th}$ ring cycles;
i is the $i^{th}$ ring of joints from the neutral point of the package;
$k_i$ is the cumulative spring stiffness of the $i^{th}$ ring of joints defined by $$k_i=1/4n_i \Sigma(1/\Delta K_j)_{j=1,i}$$

where:
n is the number of joints in the $i_{th}$ ring
$\Delta K_j$ is the incremental spring stiffness for a single ring j defined by $$\Delta K_j=(P/\Delta DNP)_j/\{1/(Eh)_t+1/(Eh)_{pkg}\}_j$$

where:
P is the joint pitch within the ring, as shown in FIG. 1
$\Delta DNP$ is the change in the distance from the neutral point of the package between successive rings
E is the modulus of elasticity
h is the structural thickness
t is the termination which forms a joint when mounted
pkg is the package Where the area-array package has an irregular array of joints, the neutral axis of the joints is no longer equivalent to the centroid of the package. In such cases, the location of the neutral axis must be determined before the above equation is applied. This calculation is known in the art and consists of first determining the package centroid by calculating the first moment of area of the package. Then calculating the neutral axis from the centroid as the first moment of the load carrying area. The distance to neutral point is measured from this neutral axis.

Although the preferred embodiment indicates use of the preceding equation, other numerical methods, e.g. finite element analysis, may be employed to determine the area of highest strain energy density.

When an area-array package is mounted upon a PCB, the location of maximum joint strain energy density has been calculated to be near the edge of the die in PBGA packages and at the corners of CCGA packages.

Figure 2:
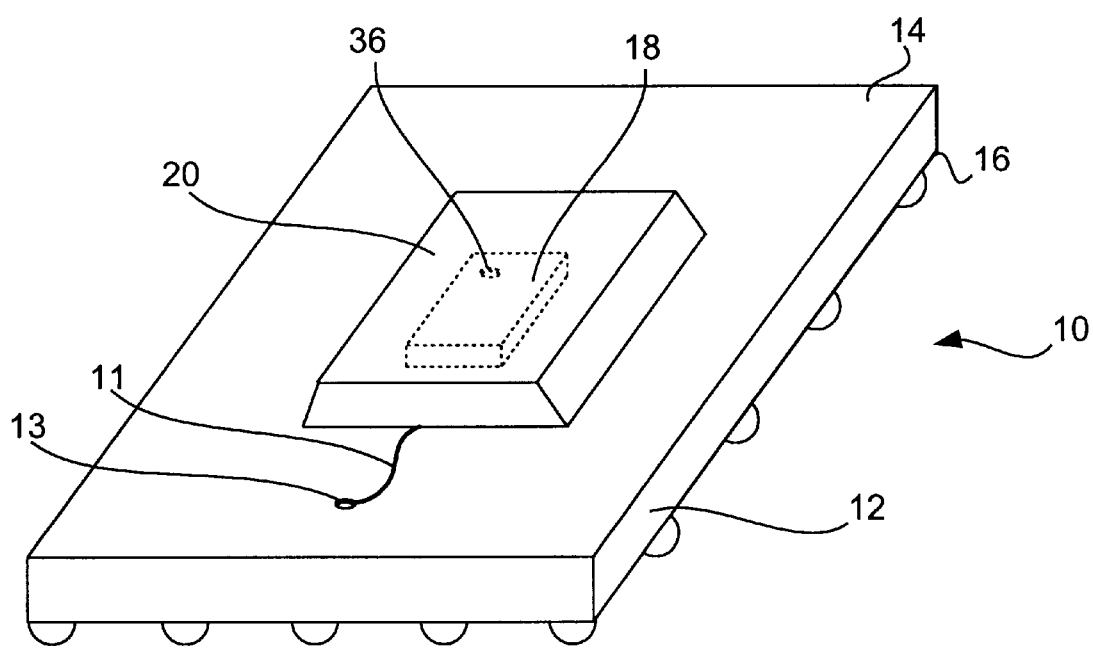
FIG. 2 is a perspective view of a PBGA package prior to mounting on a substrate in accordance with the present invention.
Figure 3:
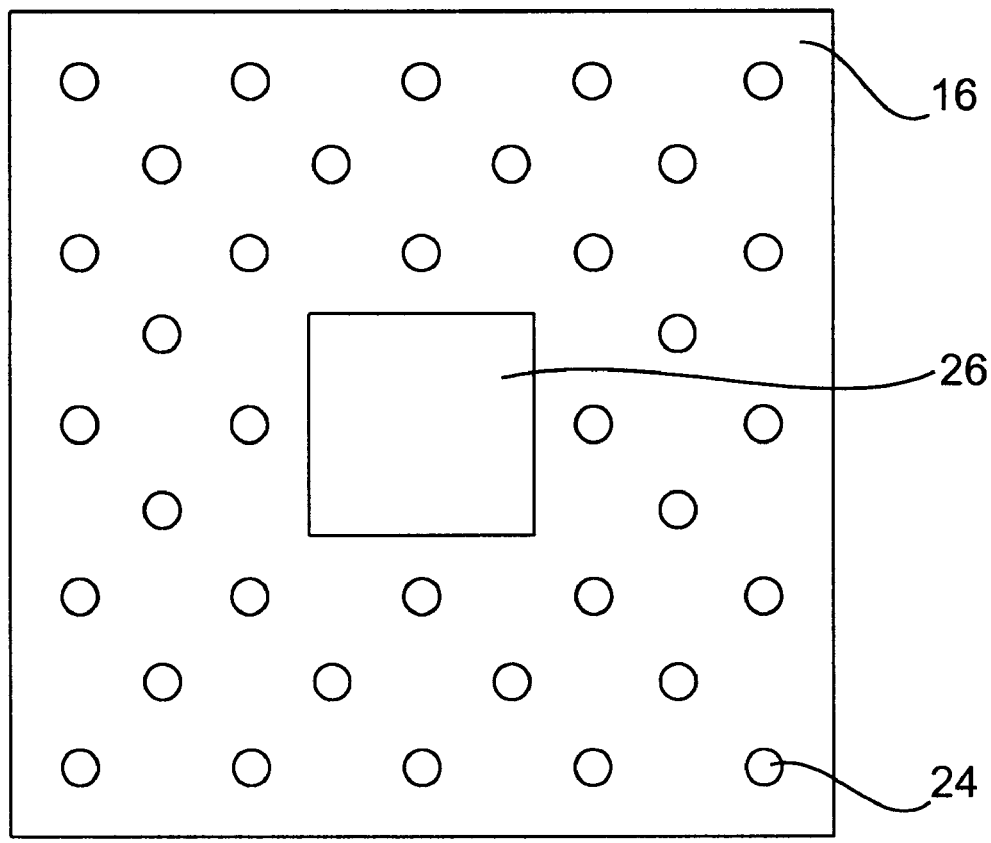
FIG. 3 is a bottom view of a PBGA package of FIG. 2 prior to mounting on a substrate in accordance with the present invention.
Figure 4:
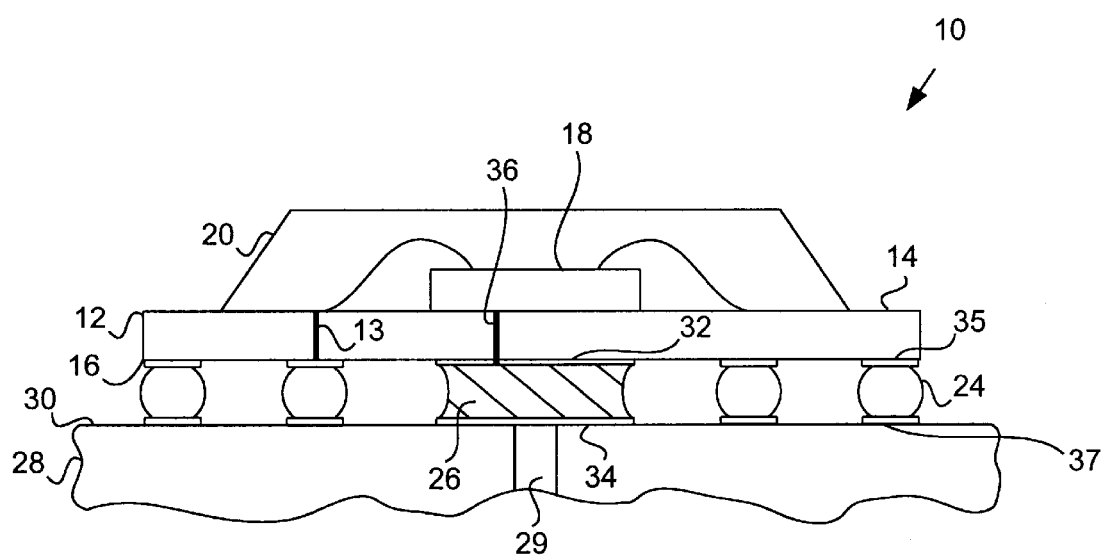
FIG. 4 is a cross-sectional view of the PBGA package of FIG. 2 mounted on a substrate in accordance with the present invention.

FIGS. 2 to 4 depict a package 10 which includes a package substrate 12 consisting of a laminated glass fibre resin structure containing a plurality of metal traces 11 and plated vias 13 interconnecting a top surface 14 of the package substrate 12 with a bottom surface 16. As shown in FIG. 4, a semiconductor die 18 is connected to a central location of the top surface 14 and it can be seen from FIGS. 2 and 3 that the surface area of the semiconductor die is significantly smaller than the surface area of the substrate 12. Although wire bonding is shown in FIG. 4, other suitable methods used in the art, e.g. flip-chip or tape automated bonding (TAB), can be used to connect the semiconductor die 18 to the package substrate 12. The package further comprises a molded body 20, preferably made of epoxy resin, molded onto the surface of the package substrate 12 by a conventional transfer molding process.

The upper molded body 20 surrounds the semiconductor die 18. The bottom surface 16 of the package substrate 12 has an array of conductive surface mount terminations 24, arranged as an array of solder balls attached to solderable pads 35, for electrical connection of the package 10 to solderable pads 37 of a substrate 28, such as a PCB. Because the coefficient of thermal expansion is the property of the substrate which effects the joint strain energy density (see the above equations) other substrates with a coefficient of thermal expansion similar to that of a PCB may also be used. Other surface mount array interconnection styles as known in the art may be used in place of the array of solder balls. When the package is designed by applying the maximum strain energy density calculation, no solder balls are located in the area beneath the die. Instead, according to the invention, an adhesive mass, preferably a mass of eutectic solder 26, is located directly under the die. As can been seen in FIGS. 3 and 4, the adhesive mass substantially fills an area directly beneath the die and only that area. In other words, the remainder of the bottom surface 16 of the substrate 12 is available for placement of solder balls.

Wetting and thus adhesion of the solder mass 26 to the top surface 30 of substrate 28 and the bottom surface 16 of the package substrate 12 may be achieved in any one of several ways. In the preferred embodiment, both the top surface 30 of the base substrate 28 and the bottom surface 16 of the package substrate 12 are provided with aligning solderable pads 32 and 34 respectively of substantially the same dimensions as the solder mass. The solderable pads 32 and 34 may either consist of one large pad or a plurality of pads covering substantially all of that portion of the substrate top surface 30 and that portion of the package substrate bottom surface 16 vertically aligned with the semiconductor die 18 when assembled, i.e. lying directly under the die 18. When the PBGA is mounted on substrate 28 using conventional pick-and-place and reflow processes, the processing steps used to bond the solder balls to the substrate, the solder mass is also reflowed and the eutectic solder bonds to both the solderable pad 34 on the substrate 28 and the solderable pad 32 on the bottom 16 of the package substrate 12.

A method for mounting a package 10 on a substrate 28 is thus to design a package 10 having a solderable pad 32 on the bottom surface 16 of the package substrate 12 and to design a substrate 28 having a solderable pad 34 on the top surface 30 of the substrate 28. Then place a solder mass substantially equal to the thickness of the solder balls on the solderable pad 32, e.g., either by printing solder paste or positioning a preformed metal alloy slug and tacking it in place as with the solder balls 24 on pads 35. Finally, apply a flux means, e.g. solder paste or liquid flux or appropriate atmosphere, to the solderable pads 34 and 37 of the substrate 28, align and place the package 10 on the substrate, and reflow in accordance with normal industry processes.

For enhanced thermal performance, the package substrate 12 may be provided with thermal vias 36 which thermally, but not electrically, connect the bottom surface of the die 18 with the solder mass 26.

Figure 5:
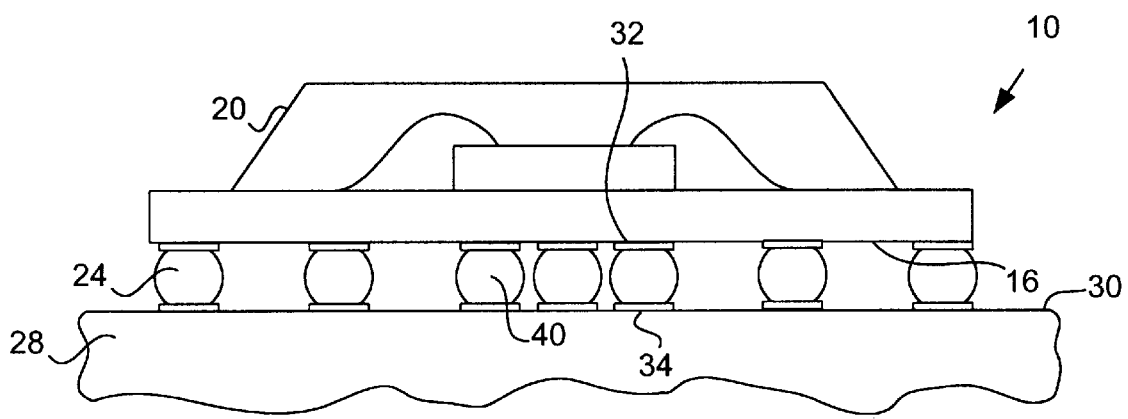
FIGS. 5 and 6 are cross-sectional views of other PBGA embodiments of the present invention.

FIG. 5 shows another embodiment of the invention also utilizing a PBGA. In FIG. 5, rather than a solid mass of solder, individual solder balls 40 are arranged between the package 10 and the substrate 28. These solder balls 40 are placed in closer proximity to each other than the solder balls 24 which are not positioned under the die 18. Again, either one solderable pad or a plurality of solderable pads are provided to allow adhesion of the solder to the package bottom surface 16 and the substrate top surface 30.

Figure 6:
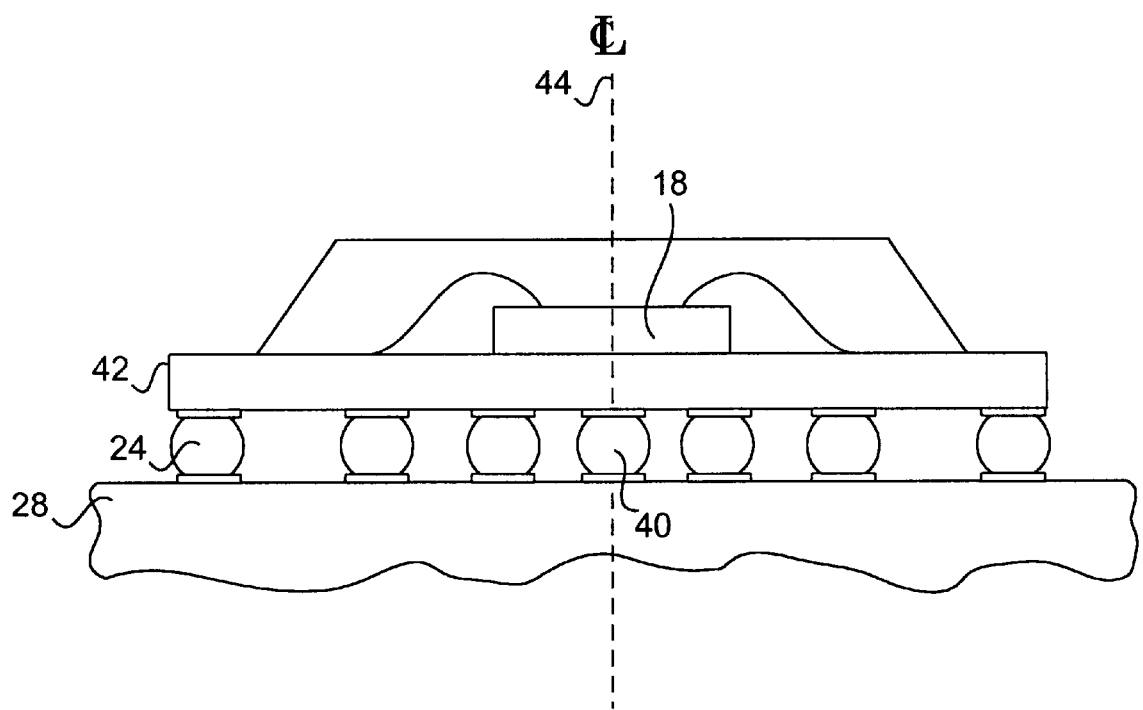

FIG. 6 shows another way of arraying the solder balls 24 and 40 to achieve a closer pitch under the die 18 by designing the substrate 28 and the PBGA package to accommodate a decreasing pitch of solder balls 24 and 40 from the perimeter of the package 42 to the centre of the package 44.

Although the preferred embodiment indicates solder as the choice of adhesive mass 26, other suitable adhesives such as a thixotropic epoxy based composite or a thixotropic polymer based composite may be employed. Such adhesives are injected through an orifice 29 in the substrate after the package 10 has been mounted on the substrate 28. The adhesive is then cured using heat, moisture, ultra violet radiation, a catalyst or other curing means. Depending on their known adhesive properties relative to the solder balls, such materials may require that a solder mask or bare laminate and not solderable pads 32 and 34 be provided on the surfaces of the package and the substrate aligned with the die 18. Also, the joints may be co-located with the adhesive in this configuration and be active where the adhesive is not electrically conductive.

Figure 7:
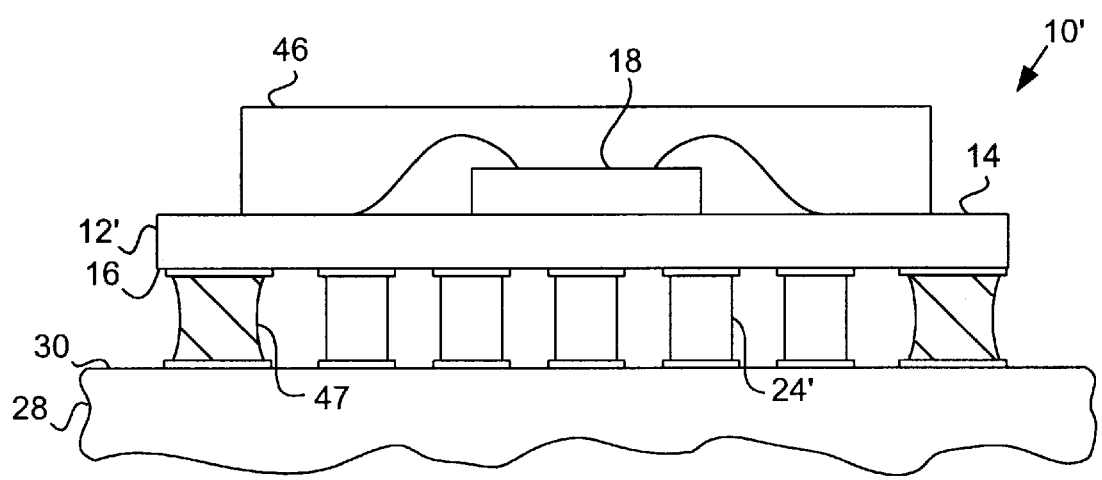
FIG. 7 is a cross-sectional view of a CCGA package mounted upon a substrate in accordance with the present invention.

FIG. 7 shows a CCGA package 10'. The structure of the CCGA package is essentially the same as the PBGA package described with reference to FIGS. 2 to 4 except that the package substrate 12' is made of a ceramic material having a coefficient of thermal expansion substantially lower than that of the glass fibre resin structure of substrate 12. Also, the semiconductor die 18 may by surrounded by a lid 46 rather then a molded body. In addition, solder balls are replaced with non-eutectic solder columns 24' and the arrangement of the solder columns on the bottom surface 16 of the package is different. According to the invention, solder masses 47 are placed at the corners of the package and solder columns are arrayed under the remainder of the package. Processing of these solder masses is the same as the processing of the solder mass described with reference to the PBGA package.

As with the PBGA package, the solder masses may be replaced with other forms of adhesive such as a thixotropic epoxy or polymer based compound.

Although placing the adhesive mass in the area indicated by the maximum strain energy calculation is preferred, positioning the adhesive mass elsewhere will provide some mechanical improvement. Thus, the adhesive mass may be positioned elsewhere for mechanical attachment independent of applying the maximum strain energy density calculation. Similarly, substrates with a coefficient of thermal expansion different from that of a PCB may be used with PBGAs and CCGAs but the advantage of placing the adhesive mass in the region of largest strain energy density may not be realized.

While the illustrated embodiments show the use of an adhesive mass primarily to improve the integrity of the mechanical connection between the package and the substrate, the adhesive mass could be used primarily for thermal management, i.e. to improve heat flow from the package to a heat sink. In such a case, the exact location of the adhesive mass may not be critical as improvement to mechanical stability is secondary. Of course, the adhesive mass would have to be a suitable highly thermally conductive material.

While the preferred embodiment, in addition to several alternative forms of the invention, has been described and illustrated, it will be apparent to one skilled in the art that further variations in the design may be made. The scope of the invention, therefore, is only to be limited by the claims appended hereto.

What is claimed is:

1. An integrated circuit package for mounting on a base substrate of local coefficient of thermal expansion $\alpha_3$ comprising:

a package substrate of local coefficient of thermal expansion $\alpha_{pkg}$, the package substrate having conductive traces on a top surface interconnected by vias to conductive traces on a bottom surface of the package substrate;

a semiconductor die mounted either on or adjacent a top surface of the package substrate and electrically connected to the conductive traces on the top surface of the package substrate;

an array of conductive surface mount terminations of finite thickness mounted on a bottom surface of the package substrate at least some of which are electrically connected to the conductive traces on the bottom surface of the package substrate;

the terminations being arranged in rings i around a neutral point of the package;

each of the rings being a distance $DNP_i$ from the neutral point of the package;

each of the rings having a number of terminations $n_i$;

each ring having a termination pitch P;

the terminations having a modulus of elasticity $E_t$ and a structural thickness $h_t$;

the package having a modulus of elasticity $E_{pkg}$ and a structural thickness $h_{pkg}$;

successive rings having a change in the distance from the neutral point of the package ΔDNP;

each of the rings cycling through a temperature range $\Delta T_i$ during operation; and at least one adhesive mass;

the at least one adhesive mass being located on the bottom of the package substrate in the area(s) where the terminations when mounted upon the base substrate to form joints would have highest joint strain energy density $W_{Gi}$ as calculated by the equations $$W_{Gi} = k_i \{DNP_i(\alpha_\beta - \alpha_{pkg})_i \Delta T_i\}^2$$

$$k_i = l/4n_i \Sigma (1/\Delta K_j)_{j-1,i}$$

$$\Delta K_j = (P/\Delta DNP)_j / \{1/(Eh)_t + 1/(Eh)_{pkg}\}_j$$

such that when mounted upon the base substrate the at least one adhesive mass will co-operate with the package substrate and the base substrate to adhere the package substrate and the base substrate to each other.

2. An integrated circuit package for mounting on a base substrate comprising:

a plastic package substrate having a coefficient of thermal expansion substantially the same as the coefficient of thermal expansion of the base substrate, the plastic package substrate having conductive traces on a top surface interconnected by vias to conductive traces on a bottom surface of the plastic package substrate;

a semiconductor die mounted either on or adjacent a top surface of the plastic package substrate and electrically connected to the conductive traces on the top surface of the plastic package substrate, the semiconductor die having a surface area significantly smaller than the surface area of the plastic package substrate;

an array of conductive surface mount terminations of finite thickness mounted on a bottom surface of the plastic package substrate at least some of which are electrically connected to the conductive traces on the bottom surface of the plastic package substrate; and an adhesive mass;

the adhesive mass being located on the bottom of the plastic package substrate and substantially filling only an area directly beneath the semiconductor die such that when mounted upon the base substrate the adhesive mass will co-operate with the plastic package substrate and the base substrate to adhere the plastic package substrate and the base substrate to each other.

3. An integrated circuit package as described in claim 2 wherein the adhesive mass comprises a mass of eutectic solder and the package substrate is provided with a solderable pad on the bottom surface in the area where the adhesive mass is applied.

4. An integrated circuit package as described in claim 3 wherein the package substrate has an array of thermal vias thermally connecting the semiconductor die to the mass of eutectic solder.

5. An integrated circuit package as described in claim 2 wherein the adhesive mass comprises a thixotropic polymer based compound.

6. An integrated circuit package as described in claim 2 wherein the adhesive mass comprises a thixotropic epoxy based compound.

7. An integrated circuit package as described in claim 1 wherein the top surface of the package substrate and semiconductor die are encapsulated by a covering means.

8. An integrated circuit package as described in claim 2 wherein the top surface of the package substrate and semiconductor die are encapsulated by a covering means.

9. An integrated circuit package as described in claim 8 wherein the covering means is a molded body of epoxy resin.

10. An integrated circuit package for mounting on a base substrate comprising:

a ceramic package substrate having a coefficient of thermal expansion substantially lower than the coefficient of thermal expansion of the base substrate, the ceramic package substrate having conductive traces on a top surface interconnected by vias to conductive traces on a bottom surface of the ceramic package substrate;

a semiconductor die mounted either on or adjacent a top surface of the ceramic package substrate and electrically connected to the conductive traces on the top surface of the ceramic package substrate;

an array of conductive surface mount terminations of finite thickness mounted on a bottom surface of the ceramic package substrate at least some of which are electrically connected to the conductive traces on the bottom surface of the ceramic package substrate;

a plurality of adhesive masses;

the adhesive masses being located on the bottom of the ceramic package substrate only at the corners of the ceramic package substrate such that when mounted upon the base substrate the adhesive masses will co-operate with the ceramic package substrate and the base substrate to adhere the ceramic package substrate and the base substrate to each other.

11. An integrated circuit package as described in claim 10 wherein the adhesive masses comprise masses of eutectic solder and the ceramic package substrate is provided with solderable pads on the bottom surface in the areas where the adhesive masses are applied.

12. An integrated circuit package as described in claim 10 wherein the adhesive masses comprise a thixotropic polymer based compound.

13. An integrated circuit package as described in claim 10 wherein the adhesive masses comprise a thixotropic epoxy based compound.

14. An integrated circuit package as described in claim 10 wherein the top surface of the package substrate and the die are enclosed by a covering means.

15. An integrated circuit package as described in claim 14 wherein the covering means is a ceramic lid.

16. An integrated circuit package for mounting on a base substrate comprising:

a package substrate, the package substrate having conductive traces on a top surface interconnected by vias to conductive traces on a bottom surface of the package substrate;

a semiconductor die mounted either on or adjacent a top surface of the package substrate and electrically connected to the conductive traces on the top surface of the package substrate;

an array of conductive surface mount terminations of finite thickness mounted on a bottom surface of the package substrate at least some of which are electrically connected to the conductive traces on the bottom surface of the package substrate; and at least one adhesive mass;

the at least one adhesive mass being located on the bottom of the package substrate only in the area(s) where the terminations when mounted upon the substrate to form joints would have highest joint strain energy density as calculated by numerical methods such that when mounted upon the base substrate the at least one adhesive mass will co-operate with the package substrate and the base substrate to adhere the package substrate and the base substrate to each other.

17. An integrated circuit package for mounting on a base substrate comprising:

a plastic package substrate having a coefficient of thermal expansion substantially the same as the coefficient of thermal expansion of the base substrate, the plastic package substrate having conductive traces on a top surface interconnected by vias to conductive traces on a bottom surface of the plastic package substrate;

a semiconductor die mounted either on or adjacent a top surface of the plastic package substrate and electrically connected to the conductive traces on the top surface of the plastic package substrate; and an array of solder balls of finite thickness mounted on a bottom surface of the plastic package substrate at least some of which are electrically connected to the conductive traces on the bottom surface of the plastic package substrate, wherein the solder balls located beneath the semiconductor die are positioned in closer proximity to each other than those not positioned beneath the semiconductor die.

18. An integrated circuit package for mounting on a base substrate comprising:

a plastic package substrate having a coefficient of thermal expansion substantially the same as the coefficient of thermal expansion of the base substrate, the plastic package substrate having conductive traces on a top surface interconnected by vias to conductive traces on a bottom surface of the plastic package substrate;

a semiconductor die mounted either on or adjacent a top surface of the plastic package substrate and electrically connected to the conductive traces on the top surface of the plastic package substrate; and an array of solder balls of finite thickness mounted on a bottom surface of the plastic package substrate at least some of which are electrically connected to the conductive traces on the bottom surface of the plastic package substrate, wherein the pitch of the solder balls decreases from the perimeter of the integrated circuit package to the centre of the integrated circuit package.

* * * * *

UNITED STATES PATENT AND TRADEMARK OFFICE
CERTIFICATE OF CORRECTION

PATENT NO. : 6,194,782 B1
DATED : February 27, 2001
INVENTOR(S) : Katchmar, Roman Page 1 of 1

It is certified that error appears in the above-identified patent and that said Letters Patent is hereby corrected as shown below:

Claim 1, column 8,
Line 48, "$\alpha_3$" should read -- $\alpha_s$ --.

Claim 1, column 9,
Line 18, "$\alpha_\beta$" should read -- $\alpha_s$ --.

Signed and Sealed this

Thirtieth Day of October, 2001

Attest:

NICHOLAS P. GODICI
Attesting Officer     Acting Director of the United States Patent and Trademark Office